US010746823B2

(12) United States Patent
De Vries et al.

(10) Patent No.: US 10,746,823 B2
(45) Date of Patent: Aug. 18, 2020

(54) TRANSPORT DEVICE FOR AN NMR MAS ROTOR IN A PROBE HEAD ("MAS SHUTTLE")

(71) Applicant: Bruker Switzerland AG, Faellanden (CH)

(72) Inventors: Jonathan De Vries, Zurich (CH); Sven Sieber, Seegraeben (CH); Roger Meister, Hinteregg (CH)

(73) Assignee: BRUKER SWITZERLAND AG, Faellanden (CH)

( * ) Notice: Subject to any disclaimer, the term of this patent is extended or adjusted under 35 U.S.C. 154(b) by 0 days.

(21) Appl. No.: 16/745,679

(22) Filed: Jan. 17, 2020

(65) Prior Publication Data

US 2020/0150199 A1    May 14, 2020

Related U.S. Application Data

(63) Continuation of application No. PCT/EP2018/068679, filed on Jul. 10, 2018.

(30) Foreign Application Priority Data

Jul. 17, 2017 (DE) .......................... 10 2017 212 192

(51) Int. Cl.
*G01R 33/30* (2006.01)
(52) U.S. Cl.
CPC .................. *G01R 33/307* (2013.01)
(58) Field of Classification Search
CPC .............................. G01R 33/307; G01R 33/30

USPC ......................................................... 324/322
See application file for complete search history.

(56) References Cited

FOREIGN PATENT DOCUMENTS

DE          102014201076 B3      3/2015
EP             1710595 A1      10/2006

OTHER PUBLICATIONS

Bruker Sample Transport, BST Installation and Technical Manual, Version 002, (Nov. 2008), 30 pages.
International Search Report in German and English, dated Oct. 9, 2018, 4 pages.

*Primary Examiner* — Melissa J Koval
*Assistant Examiner* — Courtney G McDonnough
(74) *Attorney, Agent, or Firm* — Edell, Shapiro & Finnan, LLC

(57) ABSTRACT

A transport device for transporting an NMR sample to a probe head (16), having a shuttle (15) and a locking apparatus (3) for the rotor (5), which, when attaching the shuttle to the probe head, releases the rotor, and having a detecting apparatus for detecting the rotor in the shuttle. The probe head has a positioning apparatus (2), which holds the probe head in a defined measuring position relative to the shuttle. The detecting apparatus includes a sensor line, which transmits a signal dependent on the position of the probe head to the shuttle's end. A first portion (1*a*) of the sensor line is mounted inside the shuttle and extends from the rotor in a transport state to the end of the shuttle. A second portion (1*b*) of the sensor line is mounted inside the probe head and, in the measuring position, is directly adjacent to the first portion.

21 Claims, 3 Drawing Sheets

PRIOR ART

TRANSPORT DEVICE FOR AN NMR MAS ROTOR IN A PROBE HEAD ("MAS SHUTTLE")

CROSS REFERENCE TO RELATED APPLICATIONS

This is a Continuation of International Application PCT/EP2018/068679 which has an international filing date of Jul. 10, 2018, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2017 212 192.0 filed on Jul. 17, 2017.

FIELD OF INVENTION

The present invention relates to a system comprising an NMR MAS probe head of an NMR spectrometer as well as a transport device for transporting an NMR (nuclear magnetic resonance) sample to the NMR MAS (magic angle spinning) probe head of an NMR spectrometer. In such a system, the transport device may have a shuttle as well as a two-part locking apparatus for the NMR MAS rotor, which apparatus is configured such that, when the shuttle is placed onto the NMR MAS probe head, the NMR MAS rotor is released by unlocking the locking apparatus and is transferred to the NMR MAS probe head and can be received by same. The system may also include a detecting apparatus comprising a sensor system, which makes it possible to determine whether or not the shuttle is currently loaded with an NMR MAS rotor.

BACKGROUND

Such an arrangement is known from DE 10 2014 201 076 B3 (reference [1]).

NMR spectroscopy is an efficient method for instrumental analysis. In this method, RF (radio frequency) pulses are irradiated into a measurement sample, which is placed in a strong static magnetic field, causing the alignment of nuclear spins in the measurement substance. The RF reaction of the measurement sample is then measured. From this, information is obtained integrally over a certain area of the measurement sample, the so-called active volume, and this information is evaluated in order to determine the chemical composition.

In NMR spectroscopy of samples of solid bodies, significant line broadening in the measured NMR spectra is observed, which is due to anisotropic interactions between nuclei in the sample. In the case of solid samples, it is known to rotate, at a high frequency (typically a few kHz), the measurement substance during the NMR measurement at the so-called "magic angle" of 54.74° with respect to the direction of the static magnetic field (MAS, "magic angle spinning"). In this way, line broadening due to dipolar interactions and chemical displacement may be reduced.

The measurement sample is normally composed of a cylindrical sample tube, called a rotor, which contains the measurement substance to be analyzed in a solid or liquid form. In order to perform the measurement, the rotor with the measurement substance is transferred into a stator, and is set in rotation relative to the stator, the rotor hanging within the stator. To this end, suitable gas flows are usually used. In order to radiate RF-pulses into the measurement substance and/or to receive RF signals from the measurement substance, a RF-coil arrangement is provided, which surrounds the stator.

Conversely, DE 2014 201 076 B3 (already cited at the outset) proposes a shuttle, the outer contour of which has a geometric shape such that, on the one hand, the shuttle can be used with a transport system which is designed for the transport of an HR-NMR sample spinner comprising an inserted sample tube and, on the other hand, the shuttle is also designed for the transport of an NMR MAS rotor, the shuttle including a locking apparatus for the NMR MAS rotor. This locking apparatus is formed in such a way that, when placing the shuttle on the NMR MAS probe head, the NMR MAS rotor is released by unlocking the locking apparatus and can be transferred to and received by the NMR MAS probe head.

This improved transport device according to reference [1] thus solves, for instance with respect to the system according to reference [2], the technical problem, which consists in allowing rapid switching from NMR spectroscopy of liquids to NMR spectroscopy of solids and vice versa, without requiring alterations of the transport system, but only by replacing the probe head. In both cases it is now possible to use the same transport system and in particular also the same automation equipment for the sequential feeding of a high number of samples, without alterations, both with existing NMR MAS probe heads and with NMR MAS rotors.

A special embodiment of the transport device according to the aforementioned DE 10 2014 201 076 B3 is additionally characterized in that an additional apparatus is present, which makes it possible to detect from the outside if the shuttle is currently loaded with an NMR MAS rotor. For this purpose, according to this prior art, an additional component is displaced by the NMR MAS rotor inserted in the shuttle in such a manner that it can be detected from the outside of the shuttle, visually or by means of sensors, whether or not the shuttle is loaded with an NMR MAS rotor.

SUMMARY

In contrast, the object of the present invention is to modify a system of the type defined at the outset with technical measures that are as simple as possible, in such a way that no mechanical displacements and also no additional moving components are required. It is a related object to provide for contactless, secure detection of the current loading of the shuttle, i.e. for detecting the presence of the NMR MAS rotor within the shuttle.

BRIEF DESCRIPTION OF THE INVENTION

This complex object is surprisingly and effectively achieved in that, in a generic system having the features defined at the outset, the NMR MAS probe head comprises a positioning apparatus, which has a geometric shape such that, in an NMR MAS measuring position, the transport container is arranged in a defined fixed position with respect to the NMR MAS probe head, in that the detecting apparatus comprises (i) a sensor system which makes it possible to reliably detect the presence of the NMR MAS rotor in the transport container in a contact-free manner, and also (ii) at least one sensor line, which can transmit a signal dependent on the current relative position of the transport container with respect to the NMR MAS probe head from the NMR MAS probe head to the transport container for detecting the current loading of the transport container.

The system according to the invention thus has, contrary to the previously conventional embodiment, a special sensory system, which is provided both in the shuttle system and in the probe head, which system allows a secure, contactless presence detection of the NMR MAS rotor inside the shuttle, without requiring any mechanical moving components for this purpose.

Precisely because of the possibilities offered by the invention regarding such an unproblematic automatable detection of the current loading situation of the system, the developer is provided with a particularly effective tool for a very specific, and possibly also extreme, configuration of an NMR MAS spectrometer.

It is to be expressly noted at this point that the advantages of the invention can be achieved not only in vertical NMR spectrometers but also in NMR systems having a horizontal or oblique z-axis. The indicated axial positions thus are not necessarily positioned "above" or "below" the NMR coil system but may also be positioned to the "right" or "left" of same. In any case, gravity plays a subordinate role with respect to the mode of operation of the present invention.

PREFERRED EMBODIMENTS OF THE INVENTION

In practice, a first class of embodiments of the system according to the invention is particularly effective, in which the sensor line of the detecting apparatus comprises at least one optical guide arranged within the NMR MAS probe head for forwarding an optical signal. An essential advantage of such an optical guide as the sensor line is that the corresponding sensors can receive the optical signals and are thus ready for an automated application.

In a first group of developments of this first class of embodiments, the sensor line of the detecting apparatus contains at least one optical fiber and the detecting apparatus is configured for a reflective optical measurement method for determining the current relative position of the NMR MAS rotor within the shuttle. In such an optical guide the signals are particularly insensitive with respect to interference, in particular with respect to the strong magnetic fields which are necessarily present in the case of NMR.

In a second group of developments, which is alternative to the first, the sensor line of the detecting apparatus contains at least two optical fibers, the detecting apparatus being configured for a transmitted light measurement method for determining the current relative position of the NMR MAS rotor within the shuttle. Such a transmitted light method with two conductors is more reliable, in terms of the process, than a variant with reflection (one conductor). In this case, the system is independent from the reflective surface (color, structure, etc.).

Depending on the specific application, a second class of embodiments of the transport device according to the invention may also be used, as an alternative, in which the sensor line of the detecting apparatus comprises at least one electric conductor arranged within the NMR MAS probe head for forwarding an electric signal. The advantage of an electric sensor line is that the corresponding sensor system can electrically record the signals and thus is ready for an automated application. Moreover, the electric solution is normally less expensive than the optical solution.

In a first group of developments of this second class of embodiments, the detecting apparatus is configured for an electric, in particular for a capacitive, measurement method for determining the current relative position of the NMR MAS rotor within the shuttle. By using a corresponding sensor system, the electric signals can be recorded and used for an automated operation of the NMR MAS spectrometer.

In a second group of developments alternative to the first group, the detecting apparatus is configured for an opto-electric measurement method for determining the current relative position of the NMR MAS rotor inside the shuttle. While the detection itself is performed optically, the interface to the probe head is purely electric. Advantageously, a third class of embodiments of the system according to the invention may also alternatively be envisaged, in which the sensor line of the detecting apparatus comprises at least one waveguide arranged in the NMR MAS probe head for forwarding an acoustic signal.

The embodiments of this third class may preferably comprise the fact that the acoustic signal is an ultrasound signal. With such an acoustic conductor, the signals are particularly insensitive with respect to external interference, in particular with respect to strong magnetic fields.

A fourth class of embodiments of the system according to the invention may also be advantageous in that the sensor line of the detecting apparatus comprises at least one waveguide arranged in the NMR MAS probe head for forwarding a pneumatic signal, in particular a pressure difference. Also in the case of such pneumatic conductors, the signals are extremely insensitive with respect interference, in particular again with respect to magnetic fields.

Embodiments of the classes described above may, if necessary, also be combined with one other.

Further preferred embodiments of the system according to the invention are characterized in that the two-part locking apparatus has a cam, which can slide along a slotted link on an oblique surface and which engages in a recess in the NMR MAS measurement position. Due to the alignment, a clean contacting and/or alignment of the sensor lines between the shuttle and the probe head results.

In advantageous developments of these embodiments, the locking apparatus is designed such that the cam, when engaging in the recess, actuates a plunger, by means of which the NMR MAS rotor is unlocked, so that it can slide out from the shuttle into the NMR MAS probe head. This allows a particularly simple automatization of the spectrometer operation.

Alternatively or additionally, in other embodiments, the cam, when engaging in the recess, can position the shuttle relative to the NMR MAS probe head in such a way that the first portion of the sensor line is aligned with the second portion. This measure also facilitates automation of the spectrometer operation.

Particularly preferred are variants of these embodiments and of previously described embodiments having two optical fibers, which are characterized in that the cam, when engaging in the recess, positions the shuttle relative to the NMR MAS probe head in such a way that both optical fibers are aligned coaxially.

An embodiment of the system according to the invention is also advantageous in that the plunger is retractable in the recess. The device is thus protected against an inadvertent release.

In practice, finally also embodiments of the system according to the invention are effective, in which, on one end of the shuttle, a transport interface is provided on which adapters for NMR-automata can be mounted, which adapters are different in particular with respect to their geometric and/or electric and/or pneumatic configuration. The adapter is preferably configured for a standard USC cap of the NMR MAS spectrometer currently marketed by the applicant under the product name of "SampleJet".

The scope of the present invention also covers an NMR MAS measurement position having a transport device according to the invention of the above-described type, which may also comprise an NMR magnet system and optionally a shim system as well as a cryostat.

Further advantages of the invention can be found in the description and in the drawings. Similarly, the above-mentioned features as well the features described in the following may be used individually per se or as together in any combination. The embodiments shown and described are not be understood as a definitive list, but rather are in fact examples for describing the invention.

BRIEF DESCRIPTION OF THE DRAWINGS

The invention is shown in the drawings and will be described in greater detail with reference to embodiments. In the drawings.

DETAILED DESCRIPTION

The present invention relates to a specially modified transport device for transporting an NMR sample in an NMR MAS spectrometer, in which mechanical displacements and also additional moving parts are no longer required for contactless, secure detection of the current loading of the shuttle—thus for a detection of the presence of the NMR MAS rotor within the shuttle.

An NMR MAS spectrometer normally has a temperature-controlled probe head in an NMR measurement arrangement, which comprises an NMR magnet system, a shim system, a turbine and a device for transporting an MAS rotor with a measurement sample from outside the NMR magnet system into the measurement position of the MAS rotor within the NMR probe head.

Figure 3:
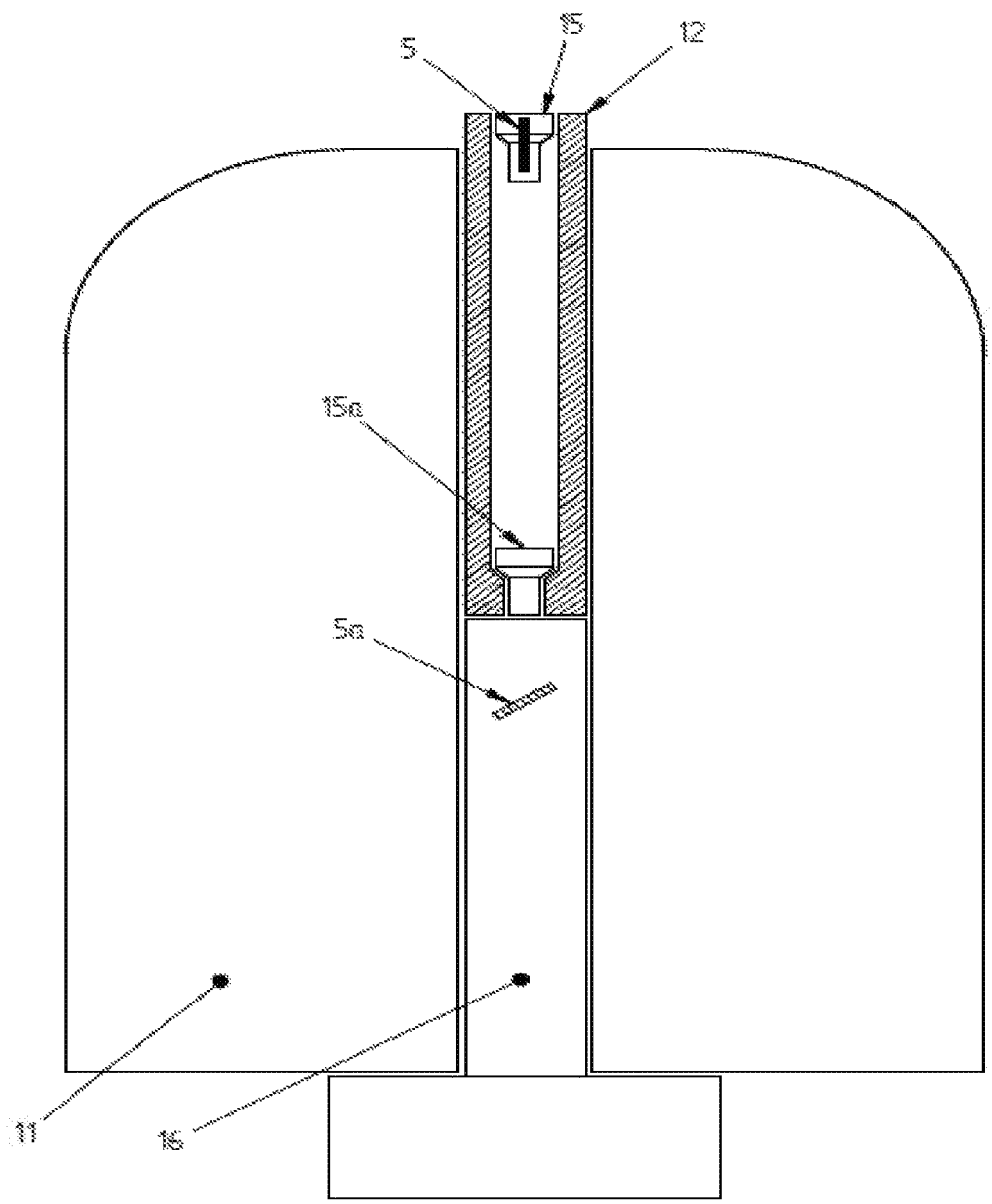
FIG. 3 is a schematic vertical sectional view of an NMR MAS spectrometer according to the prior art.

FIG. 3 schematically shows such an arrangement for the NMR MAS spectroscopy according to the prior art using a transport device for transporting an NMR sample with a transport system 12 to the NMR MAS probe head 16 of the NMR MAS spectrometer. The transport device has a shuttle 15 and a locking apparatus—which however is not shown in FIG. 3—for the NMR MAS rotor 5, which is configured in such a way that, when attaching the shuttle 15 to the NMR MAS probe head 16, the NMR MAS rotor 5 is released by unlocking the locking apparatus and is transferred to and received by the NMR MAS probe head 16. A detecting apparatus—likewise not shown in FIG. 3—is also provided, which makes it possible to detect from the outside whether or not the shuttle 15 is currently loaded with an NMR MAS rotor 5.

The probe head 16 is mounted inside a magnet 11, so that the magnetic field required for the NMR measurement is provided at the measurement location. The transport system 12, which is usually used for NMR spectroscopy of solid bodies, transports the NMR MAS rotor 5 filled with the substance to be analyzed within the shuttle 15 pneumatically to the probe head 16, by attaching the shuttle 15a to the probe head 16, the locking apparatus is unlocked and the NMR MAS rotor 5 can reach the measurement position 5a. The rotor axis is rotated within the probe head by the "magic angle" in order to perform the measurement. After the measurement, the NMR MAS rotor is pneumatically transported from its measurement position 5a initially into the shuttle 15a positioned on the probe head, and then the shuttle together with the NMR MAS rotor is again transported to the initial position.

Figure 1:
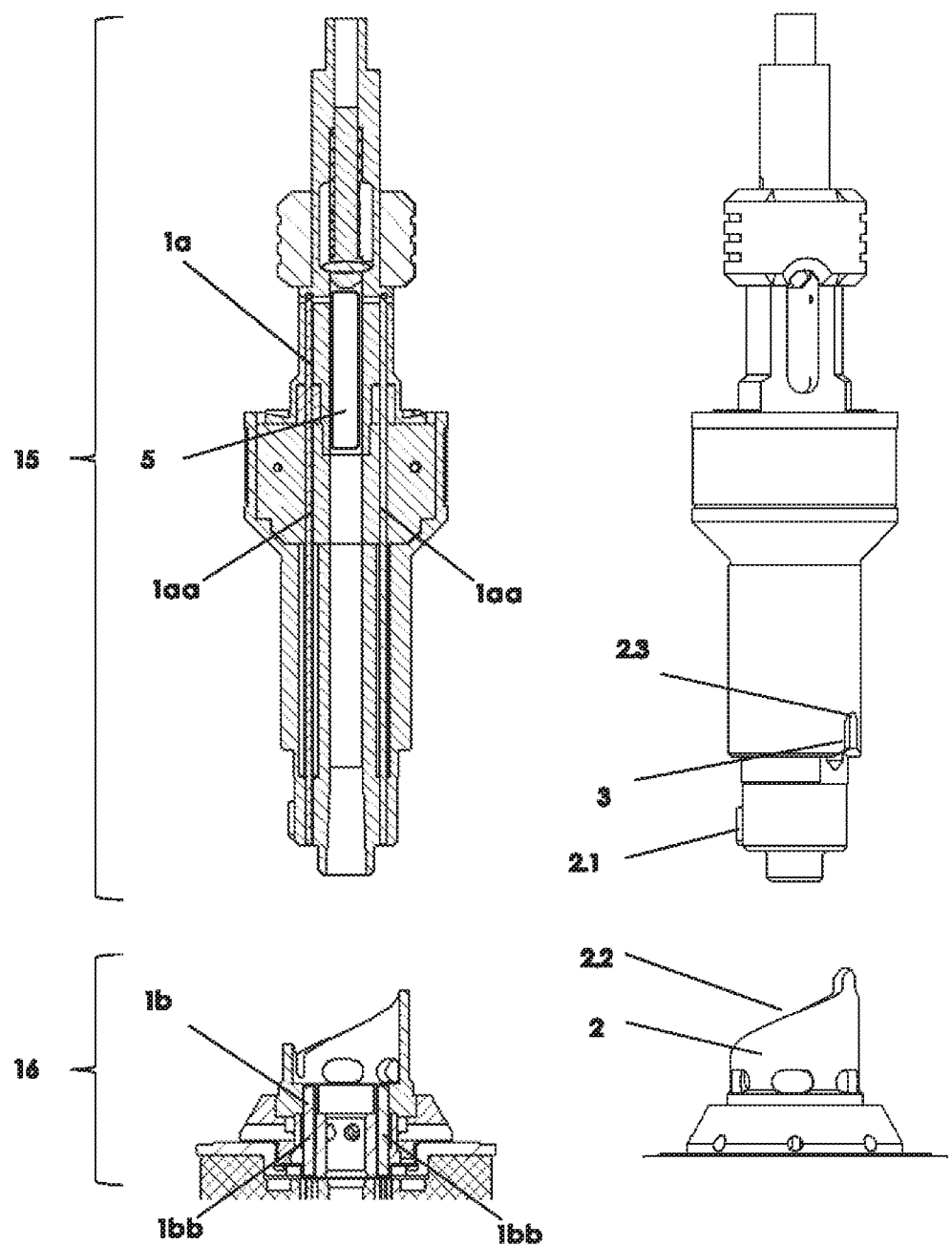
FIG. 1 is a schematic side view of a first transport device according to the invention as well as of an NMR MAS probe head before coupling the shuttle to the probe head (on the left in the vertical sectional view, on the right in the lateral plan view from outside)

In contrast to this prior art, the present invention is characterized in that the NMR MAS probe head 16—as shown in FIG. 1—has a positioning apparatus 2, which has a geometric shape such that, in an NMR MAS measurement position, the shuttle 15 is positioned in a defined fixed position with respect to the NMR MAS probe head 16. The present invention is further characterized in that the detecting apparatus comprises at least one sensor line composed of a plurality of portions 1a, 1b, which can transmit a signal dependent on the current relative position of the shuttle 15 with respect to the NMR MAS probe head 16 from the NMR MAS probe head 16 to an upper end of the shuttle 15 which is directed away from the probe head. Moreover, the present invention is characterized in that a first portion 1a of the sensor line is rigidly mounted within the shuttle 15 and extends from the position of the NMR MAS rotor 5 in a transport state of the shuttle 15 to an end of the shuttle 15. In the NMR MAS measurement position, the shuttle 15 is positioned by the positioning apparatus 2 into a defined position with respect to the NMR MAS probe head 16. Further characterizing the present invention is a second portion 1b of the sensor line that is mounted within the NMR MAS probe head 16, and, in the NMR MAS measurement position, is positioned directly adjacent to the first portion 1a, and extends from the upper probe head-side end of the positioning apparatus 2 into the NMR MAS probe head 16.

The locking apparatus 3 for the NMR MAS rotor 5 is normally divided into two parts and has a cam 2.1, which can slide along a slotted link on an oblique surface 2.2 and engages in a recess 2.3 in the NMR MAS measurement position.

Figure 2:
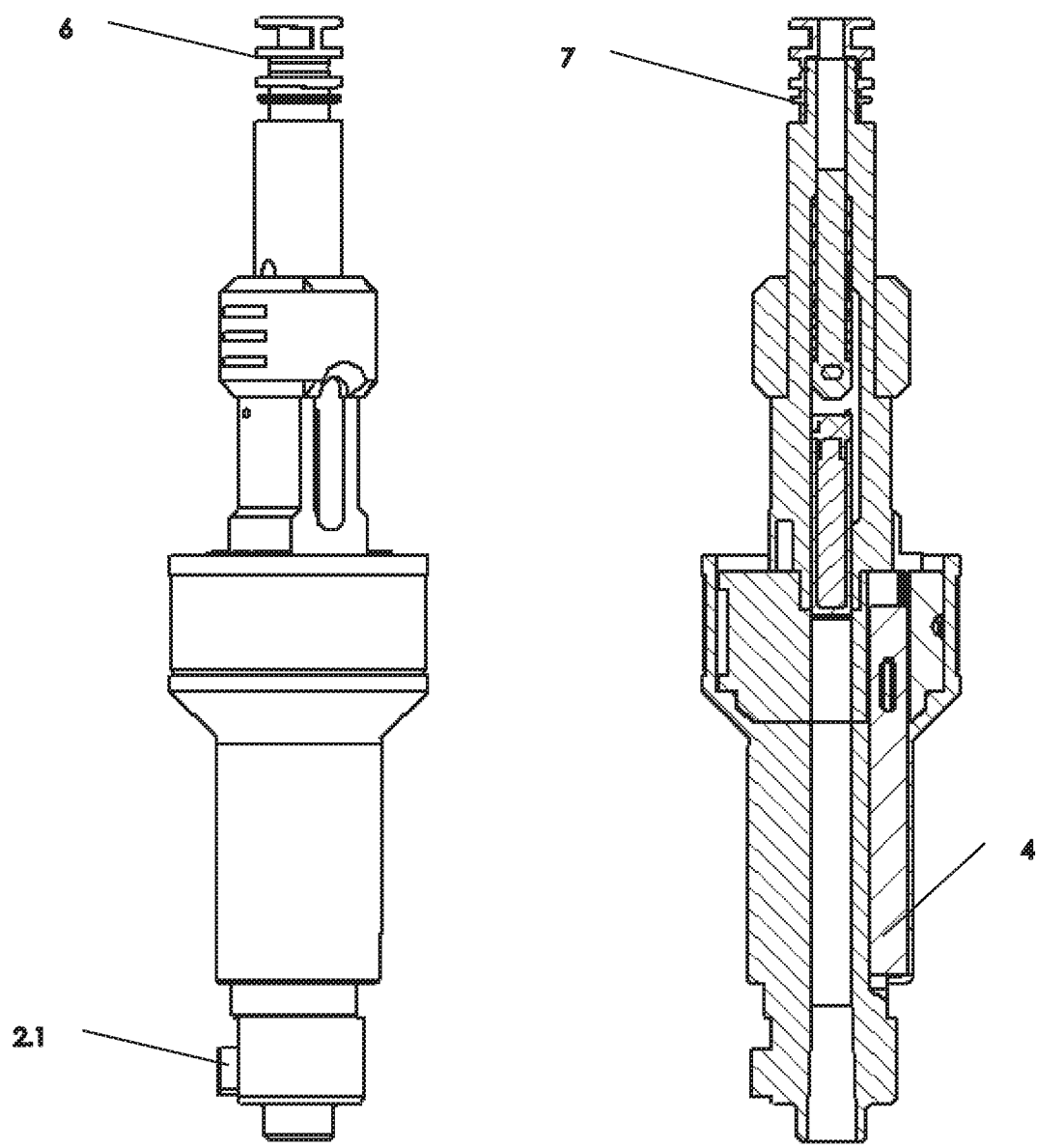
FIG. 2 is a schematic side view of a second transport device according to the invention (on the right in the vertical sectional view, on the left in the lateral plan view from outside)

As shown in FIG. 2, the cam 2.1, when engaging in the recess 2.3, actuates a plunger 4 to unlock the NMR MAS rotor 5, so that it can slide from the shuttle 15 into the NMR MAS probe head 16. The plunger 4 is normally retractable in the recess 2.3.

The cam 2.1, when engaging in the recess 2.3, will normally position the shuttle 15 relative to the NMR MAS probe head 16 in such a way that the first portion 1a of the sensor line aligns with the second portion 1b.

The sensor line can be embodied in various forms. For example, the first section 1a of the sensor line may comprise one or more optical fibers 1aa and/or be configured for an opto-electric, electric, capacitive, and/or acoustic measurement of the NMR MAS rotor 5 inside the shuttle 15. The second section 1b of the sensor line may comprise at least one light guide 1bb and/or electric conductor and/or sonic conductor disposed in the probe head 16. If the sensor line of the detecting apparatus contains at least two optical fibers, then the cam 2.1, when engaging in the recess 2.3, can position the shuttle 15 relative to the NMR MAS probe head 16 in such a way that both optical fibers are aligned coaxially.

FIG. 2 also shows an embodiment of the transport device according to the invention, in which, on one end of the shuttle 15, a transport interface 7 is provided on which adapters for NMR automata can be mounted, which adapters are different in particular with respect to their geometric and/or electric and/or pneumatic configuration. The adapter is preferably configured for the standard USC cap 6 of the NMR MAS spectrometer currently marketed by the applicant with product name "SampleJet".

LIST OF REFERENCE NUMERALS 1a first portion of the sensor line in the shuttle (15)
1aa optical fiber/electric conductor/acoustic conductor
1b second portion of the sensor line in the NMR MAS probe head (16)
1bb light guide/electric conductor/acoustic conductor
2 positioning apparatus
2.1 cam
2.2 oblique surface
2.3 recess
3 locking apparatus
4 plunger
5 NMR MAS rotor
5a NMR MAS rotor (5) in the measurement position
6 USC cap
7 transport interface
11 NMR magnet
12 transport system
15 shuttle for NMR MAS rotors (5)
15a shuttle (15), placed on the NMR MAS probe head (16)
16 NMR MAS probe head

LIST OF REFERENCES

Documents taken into consideration for the assessment of patentability:
[1] DE 10 2014 201 076 B3
[2] "Z31123 Bruker Sample Transport" Version 002, Bruker BioSpin AG, Fällanden, Switzerland, dated Nov. 21, 2008

What is claimed is:

1. System comprising:
a nuclear magnetic resonance (NMR) magic angle spinning (MAS) probe head of an NMR spectrometer,
a transport device for transporting an NMR sample to the NMR MAS probe head,
wherein the transport device comprises a transport container for an NMR MAS rotor,
wherein the transport container is configured to release the NMR MAS rotor by unlocking a locking apparatus and to transfer the NMR MAS rotor to the NMR MAS probe head, and
a detecting apparatus comprising a sensor system arranged to detect whether or not the transport container is loaded with the NMR MAS rotor,
wherein the NMR MAS probe head comprises a positioning apparatus having a geometric shape that, in a measuring position, arranges the transport container in a defined position with respect to the NMR MAS probe head,
wherein the detecting apparatus comprises a sensor system configured to detect, in a contact-free manner, whether or not the NMR MAS rotor is loaded in the transport container, and
wherein the detecting apparatus further comprises at least one sensor line arranged to transmit a signal dependent on a current relative position of the transport container with respect to the NMR MAS probe head from the NMR MAS probe head to the transport container for detecting whether or not the transport container is loaded with the NMR MAS rotor.

2. System according to claim 1, wherein the sensor line comprises a plurality of sections, wherein a first section of the sensor line is installed in the transport container and extends from a loaded position of the NMR MAS rotor in the transport container to the NMR MAS probe head, and wherein a second section of the sensor line is installed in the NMR MAS probe head and directly adjoins the first section of the sensor line in the measuring position.

3. System according to claim 1, wherein the sensor line of the detecting apparatus comprises at least one light guide arranged in the NMR MAS probe head and configured to forward an optical signal.

4. System according to claim 3, wherein the sensor line of the detecting apparatus comprises at least one optical fiber, and wherein the detecting apparatus is configured for a reflective optical measurement that detects the current relative position of the NMR MAS rotor inside the transport container.

5. System according to claim 3, wherein the sensor line of the detecting apparatus comprises at least two optical fibers, and wherein the detecting apparatus is configured for a transmitted light measurement that detects the current relative position of the NMR MAS rotor inside the transport container.

6. System according to claim 1, wherein the sensor line of the detecting apparatus comprises at least one electric conductor arranged within the NMR MAS probe head to forward an electric signal.

7. System according to claim 6, wherein the detecting apparatus is configured for an electric measurement that detects the current relative position of the NMR MAS rotor inside the transport container.

8. System according to claim 7, wherein the electric measurement comprises a capacitive measurement that detects the current relative position of the NMR MAS rotor inside the transport container.

9. System according to claim 6, wherein the detecting apparatus is configured for an opto-electric measurement that detects the current relative position of the NMR MAS rotor inside the transport container.

10. System according to claim 1, wherein the sensor line of the detecting apparatus comprises at least one hollow conductor arranged within the NMR MAS probe head to forward an acoustic signal.

11. System according to claim 10, wherein the acoustic signal is an ultrasound signal.

12. System according to claim 1, wherein the sensor line of the detecting apparatus comprises at least one hollow conductor arranged within the NMR MAS probe head to forward a pneumatic signal.

13. System according to claim 12, wherein the pneumatic signal is a pressure difference.

14. System according to claim 1, wherein the transport container comprises a locking apparatus which releases the NMR MAS rotor by unlocking the locking apparatus when the transport container is disposed onto the NMR MAS probe head.

15. System according to claim 14, wherein the locking apparatus comprises two parts.

16. System according to claim 14, wherein the locking apparatus comprises a cam configured to slide along a slotted link on an oblique surface and to snap into place in a recess in the measuring position.

17. System according to claim 16, wherein the locking apparatus is configured such that the cam, when snapping into place in the recess, actuates a plunger that unlocks the NMR MAS rotor, such that the NMR MAS rotor slides out of the transport container and into the NMR MAS probe head.

18. System according to claim 17, wherein the plunger is configured to retract in the recess.

19. System according to claim 16, wherein the cam, when snapping into place in the recess, positions the transport container relative to the NMR MAS probe head such that the first section of the sensor line aligns with the second section.

20. System according to claim 1, wherein the transport container comprises a transport interface on a first end of the transport container.

21. System according to claim 20, wherein the transport interface is configured to mount at least one of electrically and pneumatically differently configured adapters for NMR automata.

* * * * *